United States Patent
You et al.

(10) Patent No.: US 12,012,539 B2
(45) Date of Patent: Jun. 18, 2024

(54) QUANTUM DOT LAYER AND MANUFACTURING METHOD THEREOF, QUANTUM DOT COLOR FILTER, COLOR FILTER SUBSTRATE, DISPLAY PANEL, AND DISPLAY DEVICE

(71) Applicant: BOE TECHNOLOGY GROUP CO., LTD., Beijing (CN)

(72) Inventors: Juanjuan You, Beijing (CN); Li Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1120 days.

(21) Appl. No.: 16/650,912

(22) PCT Filed: Sep. 20, 2019

(86) PCT No.: PCT/CN2019/106941
§ 371 (c)(1),
(2) Date: Mar. 26, 2020

(87) PCT Pub. No.: WO2020/088142
PCT Pub. Date: May 7, 2020

(65) Prior Publication Data
US 2021/0222065 A1   Jul. 22, 2021

(30) Foreign Application Priority Data
Oct. 29, 2018   (CN) .......................... 201811266320.6

(51) Int. Cl.
C09K 11/54     (2006.01)
C09K 11/62     (2006.01)
(Continued)

(52) U.S. Cl.
CPC ............ *C09K 11/892* (2013.01); *C09K 11/54* (2013.01); *C09K 11/62* (2013.01); *G03F 7/0007* (2013.01); *G03F 7/0955* (2013.01)

(58) Field of Classification Search
CPC ......... H01L 21/02296; H01L 21/02299; H01L 33/50; C09K 11/892; C09K 11/54; C09K 11/62; G02F 1/133516; G02F 1/133519
See application file for complete search history.

(56) References Cited

U.S. PATENT DOCUMENTS

| | | | |
|---|---|---|---|
| 2004/0166423 A1 | 8/2004 | Kishimoto et al. |
| 2007/0146617 A1 | 6/2007 | Nonaka |
| 2009/0085473 A1 | 4/2009 | Ilzumi et al. |
| 2013/0069036 A1 | 3/2013 | Miyata |

(Continued)

FOREIGN PATENT DOCUMENTS

| | | |
|---|---|---|
| CN | 1991532 A | 7/2007 |
| CN | 101425565 A | 5/2009 |

(Continued)

OTHER PUBLICATIONS

DIC Global. "Acrylic Resins". Retrieved from: https://www.dic-global.com/en/products/acryl/#:~:text=Acrylic%20resins%20feature%20excellent%20transparency,molding%20materials%2C%20coatings%20and%20adhesives. on Sep. 22, 23 (Year: 2023).*

*Primary Examiner* — Matthew E. Hoban
(74) *Attorney, Agent, or Firm* — The Webb Law Firm (57) ABSTRACT

The present disclosure relates to a manufacturing method of a quantum dot layer, a quantum dot color filter, a color filter substrate, a display panel, and a display device. The manufacturing method includes: performing lyophobic treatment on a first specified region of a first transparent layer, the first transparent layer including regions corresponding to a plurality of pixel regions, each pixel region of the plurality of pixel regions comprising a first subpixel region and a region (Continued)

other than the first subpixel region, the first specified region corresponding to the region other than the first subpixel region; and preparing a lyophilic first quantum dot solution on the first transparent layer to form a first quantum dot sublayer in a region that corresponds to the first subpixel region and is not subjected to the lyophobic.

17 Claims, 4 Drawing Sheets

(51) Int. Cl.
*C09K 11/89* (2006.01)
*G02F 1/133* (2006.01)
*G03F 7/00* (2006.01)
*G03F 7/095* (2006.01)
*H01L 21/02* (2006.01)
*H01L 33/50* (2010.01)

(56) References Cited

U.S. PATENT DOCUMENTS

| | | | |
|---|---|---|---|
| 2017/0235223 A1 | 8/2017 | Liang | |
| 2017/0261848 A1 | 9/2017 | Tang | |
| 2018/0003870 A1 | 1/2018 | Wu et al. | |
| 2018/0284534 A1* | 10/2018 | Song | G02F 1/133528 |
| 2019/0214604 A1* | 7/2019 | Zhen | H01L 21/02288 |
| 2020/0203584 A1* | 6/2020 | Wei | H01L 25/0753 |

FOREIGN PATENT DOCUMENTS

| | | | |
|---|---|---|---|
| CN | 105242442 A | | 1/2016 |
| CN | 105259694 A | | 1/2016 |
| CN | 106158916 A | * | 11/2016 |
| CN | 106158916 A | | 11/2016 |
| CN | 107248523 A | | 10/2017 |
| CN | 109239967 A | | 1/2019 |
| IN | 102907176 A | | 1/2013 |
| WO | 2016063943 A1 | | 4/2016 |
| WO | WO2018036542 | * | 8/2016 |

* cited by examiner

QUANTUM DOT LAYER AND MANUFACTURING METHOD THEREOF, QUANTUM DOT COLOR FILTER, COLOR FILTER SUBSTRATE, DISPLAY PANEL, AND DISPLAY DEVICE

CROSS-REFERENCE TO RELATED APPLICATIONS

This application is the United States national phase of International Application No. PCT/CN2019/106941 filed Sep. 20, 2019, and claims priority to Chinese patent application No. 201811266320.6 filed Oct. 29, 2018, the disclosures of which are hereby incorporated by reference in their entirety.

TECHNICAL FIELD

The present disclosure relates to the technical field of display, and in particular, to a quantum dot layer and manufacturing method thereof, a quantum dot color filter, a color filter substrate, a display panel, and a display device.

BACKGROUND

With the rapid development of display technologies, people have increasingly high requirements on the performance of display products. Since the quantum dot material has a narrower spectral half-peak width, the light color emitted thereby has a higher purity, and the color gamut of the display products can be improved, and thus the quantum dot material has got tremendous attention and research.

At present, the quantum dot technology is mainly applied in a color filter substrate to use a quantum dot color filter, together with a backlight source for display.

SUMMARY

According to a first aspect of the embodiments of the present disclosure, there is provided a manufacturing method of a quantum dot layer, comprising: performing lyophilic treatment on on a first specified region on of a first transparent layer, the first transparent layer comprising regions corresponding to a plurality of pixel regions, each pixel region of the plurality of pixel regions comprising a first subpixel region and a region other than the first subpixel region, the first specified region corresponding to the region other than the first subpixel region; and preparing a lyophilic first quantum dot solution on the first transparent layer to form a first quantum dot sublayer in a region that corresponds to the first subpixel region and is not subjected to the lyophobic treatment.

In some embodiments, the region other than the first subpixel region comprises a second subpixel region. The manufacturing method further comprises: forming a second transparent layer after forming the first color filter sublayer; performing lyophobic treatment on a second specified region of a second transparent layer, the second specified region corresponding to a region other than the second subpixel region; and preparing a lyophilic second quantum dot solution on the second transparent layer to form a second quantum dot sublayer in a region that corresponds to the second subpixel region and is not subjected to the lyophobic treatment.

In some embodiments, the region other than the first subpixel region further comprises a third subpixel region, the second subpixel region being located between the first subpixel region and the third subpixel region.

In some embodiments, the lyophobic treatment is performed using CFx plasma.

In some embodiments, the manufacturing method further comprises: performing lyophilic treatment on the first transparent layer after forming the first quantum dot sublayer and before forming the second transparent layer.

In some embodiments, the lyophobic treatment is performed using a mask.

In some embodiments, the first transparent layer and the second transparent layer are of the same material, comprising a photoresist material.

In some embodiments, the lyophilic treatment is performed using $O_2$ plasma or $N_2$ plasma.

In some embodiments, the manufacturing method further comprises: forming the first transparent layer on a base substrate.

In some embodiments, the lyophobic treatment is performed using CFx plasma.

In some embodiments, the lyophilic treatment is performed using $O_2$ plasma or $N_2$ plasma.

In some embodiments, the first quantum dot solution and the second quantum dot solution are coated by means of inkjet printing, spin coating, or screen printing.

In some embodiments, the first quantum dot solution comprises a first alcohol ether solvent, a first water-soluble ligand, and a plurality of first quantum dots, and the second quantum dot solution comprises a second alcohol ether solvent, a second water-soluble ligand, and a plurality of second quantum dots.

In some embodiments, the first and second quantum dots are different in size but the same in material, and comprise at least one of CdS, CdSe, CdTe, ZnS, ZnSe, ZnTe, HgS, HgTe, GaN, GaAs, InP, or InAs.

In some embodiments, the photoresist material comprises at least one of polymethylmethacrylate, polyester, or epoxy.

According to a second aspect of the embodiments of the present disclosure, there is provided a quantum dot layer comprising: a first transparent layer comprising regions corresponding to a plurality of pixel regions, each pixel region comprising a first subpixel region and a region other than the first subpixel region; a first lyophobic layer located on an upper surface of a first specified region of the first transparent layer, the first specified region corresponding to the region other than the first subpixel region, the first lyophobic layer comprising an element constituting the first transparent layer; and a first quantum dot sublayer located in a region that corresponds to the first subpixel region, on the first transparent layer.

In some embodiments, the region other than the first subpixel region comprises a second subpixel region, the quantum dot layer further comprising: a second transparent layer covering the first quantum dot sublayer and the first lyophobic layer; a second lyophobic layer located on an upper surface of a second specified region of the second transparent layer, the second specified region corresponding to a region other than the second subpixel region, the second lyophobic layer comprising an element constituting the second transparent layer; and a second quantum dot sublayer located in a region that corresponds to the second subpixel region, on the second transparent layer.

In some embodiments, the region other than the first subpixel region further comprises a third subpixel region, the second subpixel region located between the first subpixel region and the third subpixel region.

In some embodiments, the first lyophobic layer is a surface fluorination layer of the first transparent layer; and/or the second lyophobic layer is a surface fluorination layer of the second transparent layer.

According to a third aspect of the embodiments of the present disclosure, there is provided a quantum dot color filter, comprising: a first color filter layer in a first subpixel region, comprising a first color filter sublayer and first transparent sublayers located on upper and lower sides of the first color filter sublayer; a second color filter layer in a second subpixel region, comprising a second color filter sublayer and a second transparent sublayer located between the second color filter sublayer and a base substrate; and a third color filter layer in a third subpixel region, comprising a third transparent sublayer; wherein the second subpixel region is located between the first subpixel region and the third subpixel region.

In some embodiments, the first transparent sublayer, the second transparent sublayers, and the third transparent sublayer are of the same material, comprising a photoresist material. The first color filter layer further comprises a lyophobic layer located on a side of a first transparent sublayer of the first transparent sublayers farther from the base substrate, away from the first color filter sublayer. The third color filter layer further comprises a lyophobic layer located on a side of the third transparent sublayer away from the base substrate.

According to a fourth aspect of the embodiments of the present disclosure, a color filter substrate is provided, comprising the quantum dot color filter according to any of the foregoing embodiments.

According to a fifth aspect of the embodiments of the present disclosure, a display panel comprising the aforementioned color filter substrate is provided.

According to a sixth aspect of the embodiments of the present disclosure, there is provided a display device comprising the aforementioned display panel.

Other features of the present disclosure and advantages thereof will become apparent from the following detailed description of the embodiments of the present disclosure with reference to the accompanying drawings.

BRIEF DESCRIPTION OF THE DRAWINGS

The accompanying drawings which constitute a part of the specification describe the embodiments of this disclosure, and together with the description, serve to explain the principle of this disclosure.

This disclosure can be understood more clearly with reference to the accompanying drawings according to the following detailed description, in which.

It should be noted that, the dimensions of the parts shown in the accompanying drawings are not drawn in accordance with actual proportional relationships. In addition, identical or similar reference numerals represent identical or similar composite parts.

DETAILED DESCRIPTION

The various exemplary embodiments of this disclosure are now described in detail with reference to the accompanying drawings. The description of the exemplary embodiment is merely illustrative and by no means serves as any restriction to this disclosure and its application or use. This disclosure can be implemented in many different forms and is not limited to the embodiments described here. These embodiments are provided in order to make this disclosure thorough and complete, and to fully express the scope of this disclosure to a person skilled in the art. It should be noted that, unless otherwise specified, the relative arrangements of the components and steps described in these embodiments should be interpreted as merely illustrative but not restrictive.

The use of "first," "second," and similar words in this disclosure is not intended to indicate any order, quantity, or importance, but rather is used to distinguish one element from another. The word "comprising" or the like means that the elements preceding the word encompass the elements listed after the word and do not exclude the possibility that other elements are also encompassed. "upper", "lower", "left", "right", and the like are used only to indicate relative position relations, and when an absolute position of the object being described is changed, the relative position relations may also be changed accordingly.

In the present disclosure, when a specific element is described as being positioned between a first element and a second element, there may or may not be an intervening element between the specific element and the first element or the second element.

All terms (comprising technical terms or scientific terms) that are used in this disclosure have the same meanings as those understood by a person of ordinary skill in the field to which this disclosure pertains, unless otherwise specifically defined. It should also be understood that, terms defined in common dictionaries should be interpreted as having meanings consistent with their meanings in the context of the related art, rather than being interpreted in an idealized or extremely formalized sense, unless expressly defined here.

The technologies, methods and apparatuses known to those skilled in the related fields may not be discussed in detail, but where appropriate, the techniques, methods and apparatuses should be considered as part of the specification.

In related processes of manufacturing the quantum dot layer, patterning of the quantum dot layer is achieved by printing or photolithography. The printing process is limited in precision, and is difficult to realize a high-resolution display panel. The photolithography process is to add quantum dots into a photoresist material, and form a pattern through exposure and development, or form a pattern through etching using photoresist mask. In the photoetching process, acidic or alkaline solution is required to be used, which causes the comparatively sensitive quantum dots to be easily quenched.

The present disclosure proposes a technical solution for patterning the quantum dot layer, capable of improving the quality of the quantum dot color filter.

According to some embodiments of the present disclosure, there is provided a manufacturing method of a quantum dot layer, comprising: performing lyophilic treatment on a first specified region of a first transparent layer, the first transparent layer comprising regions corresponding to a plurality of pixel regions, each pixel region comprising a first subpixel region and a region other than the first subpixel region, the first specified region corresponding to the region other than the first subpixel region; and preparing a lyophilic first quantum dot solution on the first transparent layer to form a first quantum dot sublayer in a region that corresponds to the first subpixel region and is not subjected to the lyophobic treatment.

In some embodiments, the manufacturing method further comprises: forming the first transparent layer on a base substrate.

Figure 1:
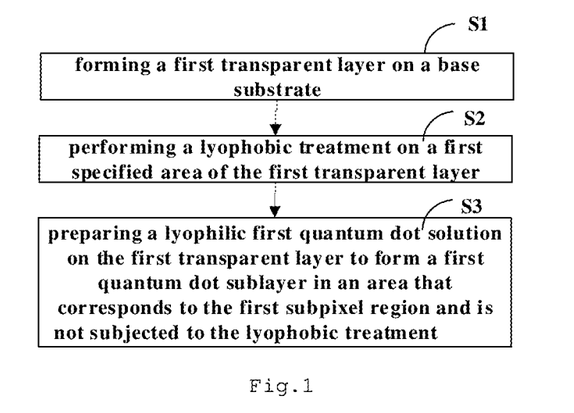
FIG. 1 is a flowchart illustrating a manufacturing method of a quantum dot layer according to an embodiment of the present disclosure.

FIG. 1 is a flowchart illustrating a manufacturing method of a quantum dot layer according to an embodiment of the present disclosure. The manufacturing method of the quantum dot color filter illustrated in FIG. 1 comprises steps S1-S3.

Figure 3A:
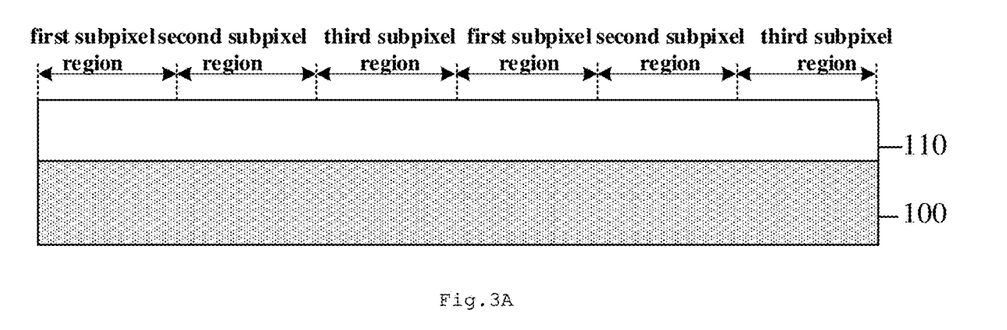
FIG. 3A is a sectional view after forming the first transparent layer according to an embodiment of the present disclosure.
Figure 3B:
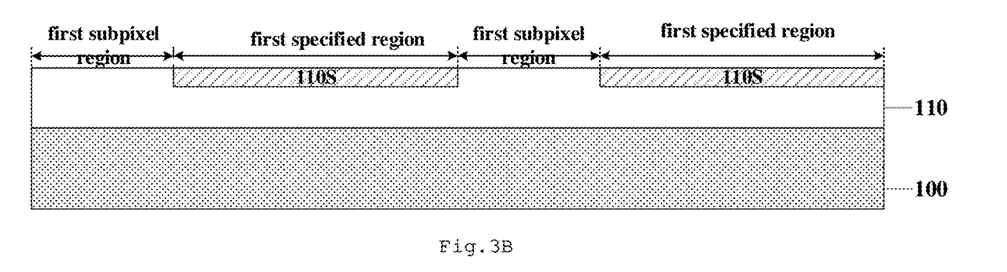
FIG. 3B is a sectional view after first lyophobic treatment according to an embodiment of the disclosure.
Figure 3C:
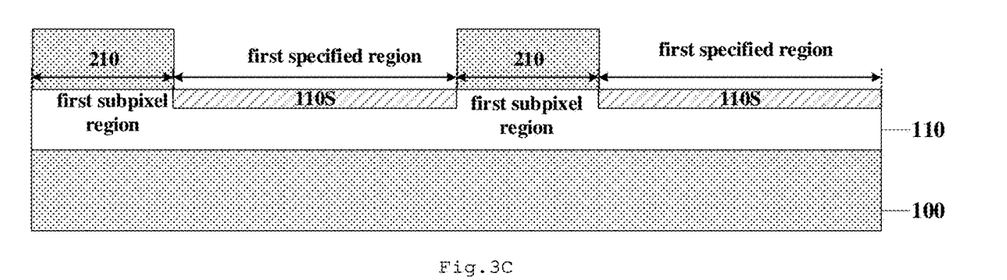
FIG. 3C is a sectional view after forming the first quantum dot sublayer according to an embodiment of the present disclosure.

FIG. 3A to 3C are sectional views illustrating structures obtained at various stages according to the method of FIG. 1. The sectional views of FIGS. 3A-3C illustrating the structures obtained at various stages of the method according to some embodiments of the present disclosure are described below with reference to the flowchart illustrated in FIG. 1.

In step S1, a first transparent layer 110 is formed on a base substrate 100.

FIG. 3A illustrates a sectional view after forming the first transparent layer according to an embodiment of the present disclosure. As shown in FIG. 3A, the base substrate 100 comprises regions corresponding to a plurality of pixel regions. Each pixel region comprises a plurality of subpixel regions, for example, a first subpixel region and a region other than the first subpixel region. In some embodiments, the region other than the first subpixel region comprises a second subpixel region. The region other than the first subpixel region may further comprise a third subpixel region. In each pixel region, a light-shielding layer, such as a black matrix, may be further provided between the respective subpixel regions.

FIG. 3A illustrates that each pixel region comprises a first subpixel region, a second subpixel region, and a third subpixel region. As shown in FIG. 3A, the second subpixel region is located between the first subpixel region 101 and the third subpixel region. The first transparent layer 110 covers the substrate 100 and also comprises regions corresponding to the plurality of pixel regions.

Herein, "corresponding to a pixel region" can be understood as: at least partially overlapping with a projection of the pixel region onto the substrate plane. FIG. 3A shows a case where the projections are completely overlapped.

In some embodiments, the first transparent layer is formed on the substrate by a solution preparation process such as inkjet printing, spin coating, or screen printing, in combination with a drying process. The material of the base substrate can be glass. The material of the first transparent layer may be a photoresist material, for example selected from polymethylmethacrylate, polyester, epoxy, or any combination thereof.

It should be understood that the first transparent layer may also not be formed on a separate base substrate, e.g. the first transparent layer may be part of a light source structure.

In step S2, a first specified region on the first transparent layer 110 is subjected to lyophobic treatment. The first specified region corresponds to the region other than the first subpixel region. For example, the lyophobic treatment may be performed on a region that corresponds to the second and third subpixel regions, on the first transparent layer 110.

FIG. 3B illustrates a sectional view after a first lyophobic treatment according to an embodiment of the present disclosure.

In some embodiments, the first specified region on the first transparent layer 110 is subjected to the lyophobic treatment using a mask. Compared with the patterning process in the related art, the opening of the mask in this embodiment can be enlarged to an area of two subpixels, which can reduce the processing difficulty.

As an example, the first specified region on the first transparent layer may be subjected to the lyophobic treatment using CFx plasma so that an upper surface of the specified region has lyophobic property. For example, a first lyophobic layer 110S is formed on the upper surface of the first specified region on the first transparent layer, as shown in FIG. 3B. The first lyophobic layer is a surface fluorination layer of the first transparent layer, and the material thereof may be fluorinated polymethyl methacrylate, fluorinated polyester, fluorinated epoxy resin, or any combination thereof.

At step S3, a lyophilic first quantum dot solution is prepared on the first transparent layer 110 to form a first quantum dot sublayer 210 in a region that corresponds to the first subpixel region and is not subjected to the lyophobic treatment.

FIG. 3C illustrates a sectional view after forming the first quantum dot sublayer according to an embodiment of the present disclosure.

As an example, the preparation of the quantum dot solution may be achieved by a solution preparation process such as inkjet printing, spin coating, or screen printing. Since the upper surface of the first specified region of the first transparent layer 110 has lyophobicity, that is, due to the presence of the first lyophobic layer 110S, the coated lyophilic first quantum dot solution will flow to the upper surface of the region that is not subjected to the lyophobic treatment (i.e., the region corresponding to the first subpixel region).

In some embodiments, the first quantum dot solution comprises an alcohol ether solvent, a water-soluble ligand, and a plurality of first quantum dots. In addition, in the preparation process of the quantum dot solution, water-soluble quantum dots may be dispersed in an organic ketone to prevent the quantum dots from agglomerating.

The alcohol ether solvent may be selected from the group consisting of ethylene glycol methyl ether, ethylene glycol ethyl ether, ethylene glycol propyl ether, ethylene glycol butyl ether, propylene glycol methyl ether, propylene glycol ethyl ether, propylene glycol n-propyl ether, propylene glycol isopropyl ether, propylene glycol n-butyl ether, propylene glycol t-butyl ether, diethylene glycol ether, diethylene glycol methyl ether, diethylene glycol dimethyl ether, diethylene glycol ethyl ether, diethylene glycol diethyl ether, diethylene glycol butyl ether, diethylene glycol dibutyl ether, diethylene glycol hexyl ether, dipropylene glycol methyl ether, dipropylene glycol dimethyl ether, dipropylene glycol monoethyl ether, dipropylene glycol diethyl ether, dipropylene glycol butyl ether, triethylene glycol ethyl ether, tripropylene glycol methyl ether, tripropylene glycol butyl ether, or any combination thereof.

The group carried by the water-soluble ligand may be selected from the group consisting of a carboxylic acid group, an amine group, a thiol group, a phosphonic acid group, or any combination thereof. The quantum dot material may be modified with a water-soluble ligand by using a mercapto silicone polymer, to obtain water-soluble quantum dots.

In some embodiments, the material for the first quantum dots is a red quantum dot material. In other embodiments, the material for the first quantum dots is a green quantum dot material. The quantum dot material may be selected from CdS, CdSe, CdTe, ZnS, ZnSe, ZnTe, HgS, HgTe, GaN, GaAs, InP, InAs, or any combination thereof. The quantum dots with different colors can emit light by adjusting the size of the quantum dots. Taking CdTe quantum dot as an example, when the particle size is changed from 2.5 nm to 4.0 nm, the emission wavelength of the quantum dot can be red-shifted from 510 nm to 660 nm, i.e. the quantum dots with different colors can emit light from green to red.

As an example, after the first quantum dot solution flowing to the upper surface of the region corresponding to the first subpixel region is subjected to a drying treatment, the first quantum dot sublayer 210 is formed. In some embodiments, the first quantum dot solution may be baked at 50-100° C. for 0.5-2 hours.

Taking the first subpixel region, the second subpixel region, and the third subpixel region corresponding to a red subpixel region, a green subpixel region, and a blue subpixel region, respectively, as an example, a red quantum dot sublayer may be formed by the method of FIG. 1.

Specifically, by performing lyophilic treatment on a region corresponding to the green and blue subpixel regions, on the first transparent layer, a red quantum dot sublayer is formed only in a region not subjected to the lyophobic treatment (i.e., the region corresponding to the red subpixel region).

It should be understood that, regions corresponding to the blue and red subpixel regions, on the first transparent layer, may be also subjected to the lyophobic treatment, such that a green quantum dot sublayer is formed only in a region not subjected to the lyophobic treatment (i.e., the region corresponding to the green subpixel region).

Figure 2:
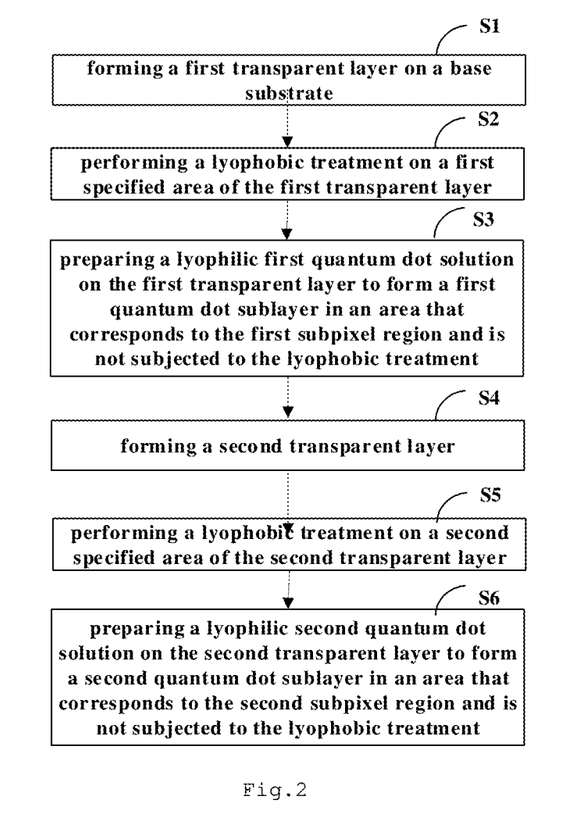
FIG. 2 is a flowchart illustrating a manufacturing method of a quantum dot layer according to another embodiment of the present disclosure.

FIG. 2 is a flowchart illustrating a manufacturing method of a color filter sublayer according to another embodiment of the disclosure. FIG. 2 differs from FIG. 1 in further comprising steps S4-S6. Only the differences will be described below, and the same parts will not be described again.

Figure 4A:
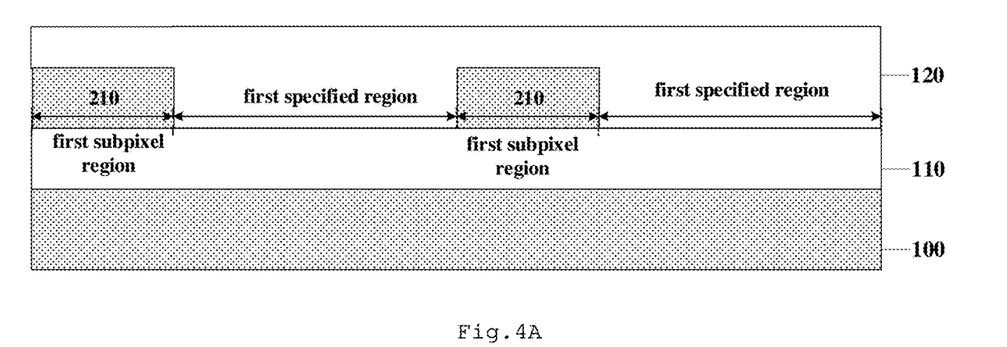
FIG. 4A illustrates a sectional view after forming the second transparent layer according to an embodiment of the present disclosure.
Figure 4B:
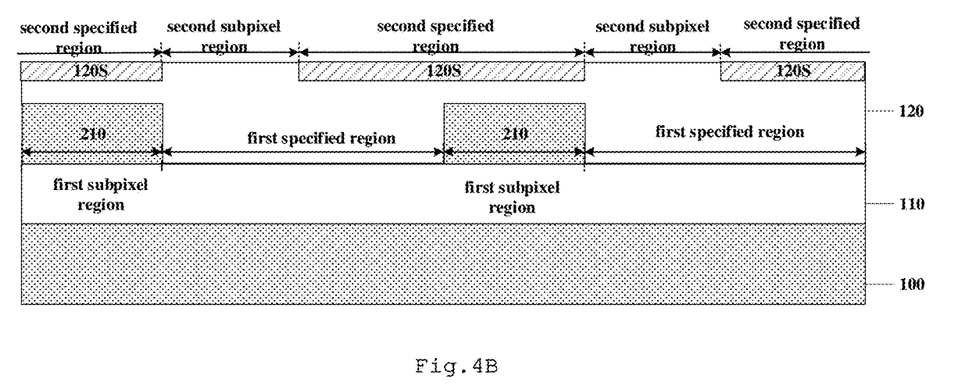
FIG. 4B illustrates a sectional view after second lyophobic treatment according to an embodiment of the disclosure.
Figure 4C:
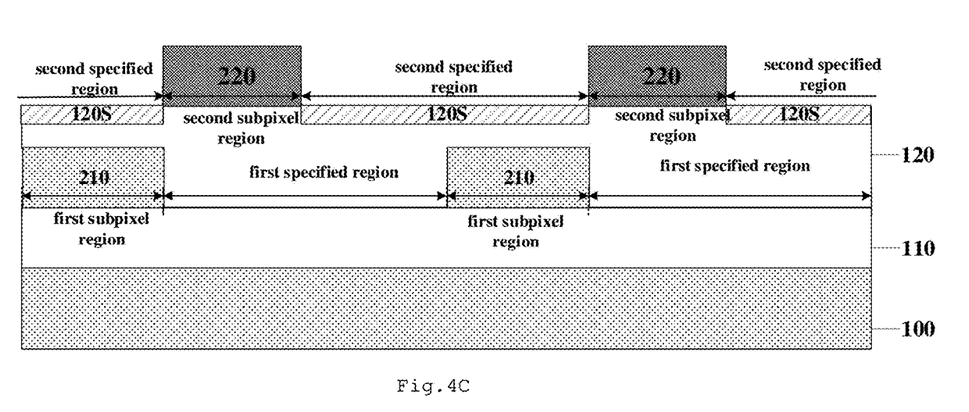
FIG. 4C illustrates a sectional view after forming a second quantum dot sublayer according to an embodiment of the present disclosure.

FIGS. 4A to 4C are sectional views illustrating structures obtained at various stages according to the method of FIG. 2. The sectional views of FIGS. 4A-4C illustrating the structures obtained at various stages of the method according to some embodiments of the present disclosure are described below with reference to the flowchart illustrated in FIG. 2.

In step S4, a second transparent layer 120 is formed after forming the first quantum dot sublayer 210.

FIG. 4A illustrates a sectional view after forming the second transparent layer according to an embodiment of the present disclosure. As shown in FIG. 4A, the second transparent layer 120 covers the first transparent layer 110 and the first quantum dot sublayer 210.

The second transparent layer 120 may adopt the same material as the first transparent layer 110, and may be formed with the same process. That is, the second transparent layer may be also made of a photoresist material, for example selected from polymethyl methacrylate, polyester, epoxy, or any combination thereof. The second transparent layer may also be formed with a solution preparation process such as inkjet printing, spin coating, or screen printing, in combination with a drying process.

The thickness of the second transparent layer may be chosen according to the actual needs, e.g. may be larger than that of the first transparent layer. Under the condition that the second transparent layer is thicker, the surface of the second transparent layer can be flatter due to the fluidity of the solution, so as to omit a flattening process and simplify the flow.

In some embodiments, the first transparent layer 110 may be subjected to lyophilic treatment prior to forming the second transparent layer 120, to avoid the effect of the previous lyophobic treatment. For example, lyophilic treatment may be performed on the first transparent layer 110 using $O_2$ plasma or $N_2$ plasma. Such lyophilic treatment may change the property of the first lyophobic layer 110S on the upper surface of the first transparent layer 110 to restore its lyophilic property, but may have little influence on the first quantum dot sublayer 210. For example, the first transparent layer shown in FIG. 4A no longer comprises the first lyophobic layer 110S shown in FIG. 3B in the first specified region.

In step S5, lyophobic treatment is performed on a second specified region on the second transparent layer 120. The second specified region corresponds to a region other than the second subpixel region. For example, the second specified region (i.e., a region corresponding to the third subpixel region and the first subpixel region) on the second transparent layer 120 may be subjected to the lyophobic treatment.

FIG. 4B illustrates a sectional view after a second lyophobic treatment according to some embodiments of the present disclosure.

The second transparent layer 120 may be subjected to the lyophobic treatment using the same process as the first transparent layer 110. That is, the second specified region on the second transparent layer may be subjected to the lyophobic treatment using CFx plasma so that the upper surface of the second specified region has a lyophobic property. For example, a second lyophobic layer 120S is formed on an upper surface of the second specified region on the second transparent layer, as shown in FIG. 4B.

In some embodiments, the second specified region on the second transparent layer 120 may also be subjected to the lyophobic treatment using a mask. In this way, the two lyophobic treatments may use the same mask, thereby simplifying the process and reducing the cost.

In step S6, a lyophilic second quantum dot solution is coated on the second transparent layer 120 to form a second quantum dot sublayer 220 in a region that corresponds to the second subpixel region and is not subjected to the lyophobic treatment.

FIG. 4C illustrates a sectional view after forming the second quantum dot sublayer according to an embodiment of the present disclosure.

The second quantum dot sublayer 220 may be formed using a process similar to the first quantum dot sublayer 210. That is, the second quantum dot sublayer 220 may also be formed using a solution preparation process such as inkjet printing, spin coating, or screen printing, in combination with a drying process. Similar to the first quantum dot solution, the second quantum dot solution comprises an alcohol ether solvent, a water-soluble ligand, and a plurality of second quantum dots. In addition, the quantum dots can be dispersed in the organic ketone by utilizing the stabilizing effect of the organic ketone on the quantum dots so as to prevent the quantum dots from agglomerating.

In some embodiments, the second quantum dot solution uses the same alcohol ether solvent, water soluble ligand, and quantum dots of the same material as the first quantum dot solution. That is, the second quantum dot solution differs from the first quantum dot solution only in the size of the quantum dots, so that the second quantum dot sublayer 220 is formed to have a different property from the first quantum dot sublayer 210 and emit light of a different color.

It should be understood that the second quantum dot solution may also use a different alcohol ether solvent, a different water soluble ligand, or a different quantum dot material than the first quantum dot solution.

Still taking the first subpixel region, the second subpixel region, and the third subpixel region corresponding to the red subpixel region, the green subpixel region, and the blue subpixel region, respectively, as an example, the red quantum dot sublayer and the green quantum dot sublayer may be sequentially formed by the method of FIG. 2.

Specifically, first, by performing lyophobic treatment on a region corresponding to the green subpixel region and the blue subpixel region on the first transparent layer, a red quantum dot sublayer is formed only in a region not subjected to the lyophobic treatment (i.e., a region corresponding to the red subpixel region); then, by performing the lyophobic treatment on a region corresponding to the blue subpixel region and the red subpixel region on the second transparent layer, a green quantum dot sublayer is formed only in a region not subjected to the lyophobic treatment (i.e., a region corresponding to the green subpixel region).

It should be understood that the green quantum dot sublayer may be formed first and then the red quantum dot sublayer. The order of forming the red quantum dot sublayer and the green quantum dot sublayer is not limited to the order described in the embodiments of the present disclosure.

In the above embodiment, by setting the lyophobic region on the transparent layer, patterning of different quantum dot sublayers can be realized without a photolithography process. The luminescence of the quantum dots will not be quenched due to the contact with an acidic or alkaline solvent in the photolithography process, and thus the quality of the formed quantum dot layer can be significantly improved.

According to an embodiment of the present disclosure, a color filter substrate is further provided, comprising a quantum dot color filter formed according to any of the foregoing manufacturing methods.

Figure 4D:
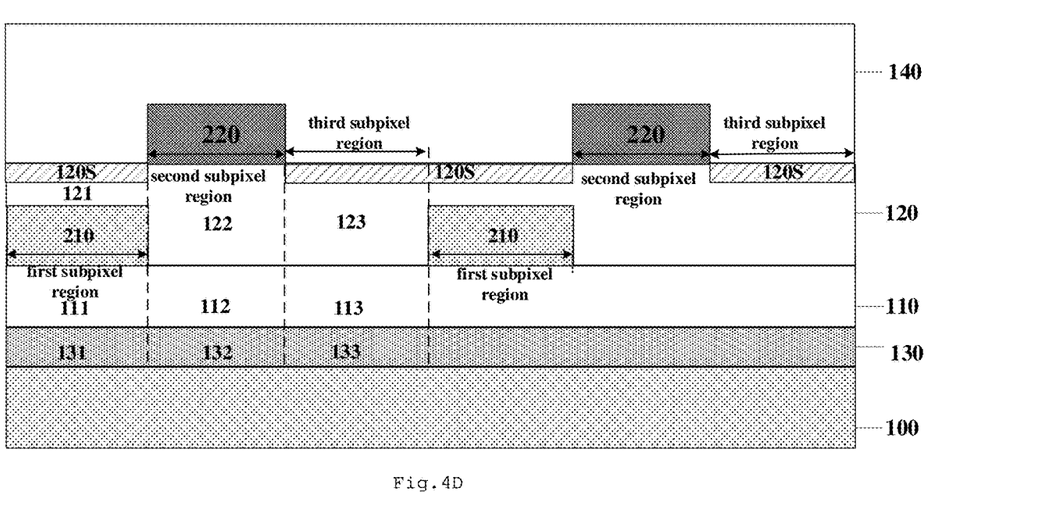
FIG. 4D is a sectional view illustrating a color filter substrate according to an embodiment of the present disclosure.

In some embodiments, the quantum dot color filter comprises: a first color filter layer located in the first subpixel region, a second color filter layer located in the second subpixel region and a third color filter layer located in the third subpixel region. The structure of each color filter layer according to an embodiment of the present disclosure is described below with reference to FIG. 4D. FIG. 4D is a sectional view illustrating a color filter substrate according to an embodiment of the present disclosure.

As shown in FIG. 4D, the first color filter layer comprises a first color filter sublayer 210 and first transparent sublayers located at both sides of the first color filter sublayer 210. The first transparent sublayers 111 and 121 above and below the first color filter sublayer 210 are part of the first transparent layer 110 and the second transparent layer 120, respectively.

The second color filter layer comprises a second color filter sublayer 220 and a second transparent sublayer located between the second color filter sublayer 210 and the base substrate 100. The second transparent sublayer may be two layers 112 and 122 that are part of the first transparent layer 110 and the second transparent layer 120, respectively.

The third color filter layer comprises a third transparent sublayer. The third transparent sublayer may comprise two layers 113 and 123, which are part of the first transparent layer 110 and the second transparent layer 120, respectively.

In some embodiments, the first color filter layer further comprises a lyophobic layer on a side of the first transparent sublayer farther from the base substrate, away from the first color filter sublayer 210. As shown in FIG. 4D, the lyophobic layer of the first color filter layer is a part of the second lyophobic layer 120S, and is located above the first transparent sublayer 121.

In some other embodiments, the third color filter layer further comprises a lyophobic layer on a side of the third transparent sublayer away from the base substrate 100. As shown in FIG. 4C, the lyophobic layer of the third color filter layer is also a part of the second lyophobic layer 120S, and is located above the third transparent sublayer 123.

In some embodiments, as shown in FIG. 4D, the color filter substrate further comprises an encapsulation layer 140. The material of the encapsulating layer 140 is, for example, an inorganic film material such as silicon nitride or silicon oxide.

The color filter substrate is used in combination with a backlight source for realizing color display. According to an embodiment of the present disclosure, a display panel comprising the aforementioned color filter substrate is further provided. In some embodiments, the display panel comprises the color filter substrate and a blue backlight source, wherein the color filter substrate comprises a transparent layer, a red color filter layer and a green color filter layer. The display panel may be, for example, a liquid crystal display panel. The blue backlight source may be a blue LED light source or a blue OLED light source.

In some embodiments, the color filter substrate may further comprise an additional color filter layer 130, as shown in FIG. 4D. According to the light conversion efficiency of the quantum dot color filter to the blue light source, the color filter layer 130 may comprise a color filter 131 (e.g., a red color filter) corresponding to the first subpixel region, and may further comprise a color filter 132 (e.g., a green color filter) corresponding to the second subpixel region. The color filter layer 130 comprises a planarization layer 133 at a position corresponding to the blue subpixel region. The red color filter and the green color filter can absorb unconverted blue light when the quantum dot color filter does not completely convert light of the blue light source. It should be understood that when the quantum dot color filter completely converts the light of the blue light source, the color filter substrate does not need an additional color filter layer.

Figure 4E:
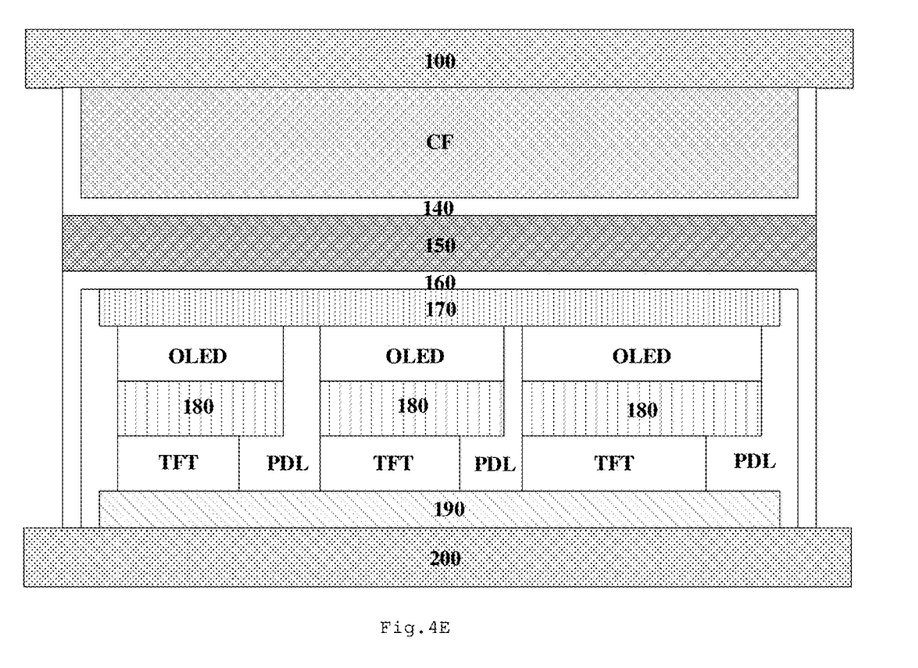
FIG. 4E is a sectional view illustrating a display panel according to an embodiment of the present disclosure.

FIG. 4E illustrates a sectional view of a display panel according to an embodiment of the present disclosure. As described above, the display panel comprises the color filter substrate and the blue backlight source portion.

As shown in FIG. 4E, the color filter substrate comprises a base substrate 100, a quantum dot color filter CF, and an encapsulation layer 140. The structure of the quantum dot color filter CF is similar to that in FIG. 4C or FIG. 4D, and comprises a first quantum dot color filter 210, a second quantum dot color filter 220, a first transparent layer 110, a second transparent layer 120, and the like.

As shown in FIG. 4E, the blue backlight source portion comprises a base substrate 200, an organic light emitting diode OLED, a cathode electrode 170 and an anode electrode 180 at both sides of the OLED. The cathode 170 is made of a thin metal such as Mg: Ag. The anode 180 comprises a plurality of electrodes separated by a pixel defining layer PDL. The material of the anode 180 is, for example, Indium Tin Oxide (ITO). The material of the pixel defining layer is, for example, an acrylic material or epoxy resin material. The blue backlight source portion further comprises thin film transistors TFTs for controlling the OLEDs corresponding to the respective subpixels, respectively. The blue backlight source portion also comprises an encapsulation layer 160. The encapsulation layer 160 is, for example, an organic/inorganic multi-layered overlapping thin film. The inorganic material is, for example, silicon oxide or silicon nitride. The organic material is, for example, acrylic material or epoxy resin material. In some embodiments, the blue backlight source portion further comprises an auxiliary electrode 190 between the base substrate 200 and the TFT.

As shown in FIG. 4E, the display panel further comprises a circular polarizer 150 between the encapsulation layer 140 of the color filter substrate and the encapsulation layer 160 of the blue backlight source portion.

According to an embodiment of the present disclosure, there is provided a display device comprising the aforementioned display panel. In some embodiments, the display device may be: any product or component with a display function, such as a mobile phone, a tablet computer, a television, a display, a notebook computer, a digital photo frame, a navigator and the like.

So far, the various embodiments of this disclosure have been described in detail. In order to avoid shielding the idea of this disclosure, some of the details well known in the art are not described. Those skilled in the art can fully understand how to carry out the technical solutions disclosed herein according to the above description.

Although some specific embodiments of this disclosure have been described in detail by way of examples, those skilled in the art should understand that the above examples are for illustrative purposes only, but not for limiting the scope of this disclosure. Those skilled in the art should understand that the above embodiments can be modified or some technical features can be equivalently replaced without departing from the scope and spirit of this disclosure. The scope of this disclosure is limited by the attached claims.

What is claimed is:

1. A manufacturing method, comprising:
   performing lyophobic treatment on a first specified region of a first transparent layer, the first transparent layer comprising regions corresponding to a plurality of pixel regions, each pixel region of the plurality of pixel regions comprising a first subpixel region and a region other than the first subpixel region, the first specified region corresponding to the region other than the first subpixel region, and the region other than the first subpixel region comprises a second subpixel region;
   preparing a lyophilic first quantum dot solution on the first transparent layer to form a first quantum dot sublayer in a region that corresponds to the first subpixel region and is not subjected to the lyophobic treatment;
   forming a second transparent layer after forming the first quantum dot sublayer;
   performing lyophobic treatment on a second specified region of the second transparent layer, the second specified region corresponding to a region other than the second subpixel region; and
   preparing a lyophilic second quantum dot solution on the second transparent layer to form a second quantum dot sublayer in a region that corresponds to the second subpixel region and is not subjected to the lyophobic treatment.

2. The manufacturing method according to claim 1, wherein the region other than the first subpixel region further comprises a third subpixel region, the second subpixel region being located between the first subpixel region and the third subpixel region.

3. The manufacturing method according to claim 1, wherein the lyophobic treatment is performed using CFx plasma.

4. The manufacturing method according to claim 1, further comprising:
   performing lyophilic treatment on the first transparent layer after forming the first quantum dot sublayer and before forming the second transparent layer.

5. The manufacturing method according to claim 1, wherein the lyophobic treatment is performed using a mask.

6. The manufacturing method according to claim 1, wherein the first transparent layer and the second transparent layer are of the same material, comprising a photoresist material.

7. The manufacturing method according to claim 4, wherein the lyophilic treatment is performed using $O_2$ plasma or $N_2$ plasma.

8. The manufacturing method according to claim 1, wherein the first quantum dot solution comprises a first alcohol ether solvent, a first water-soluble ligand, and a plurality of first quantum dots, and the second quantum dot solution comprises a second alcohol ether solvent, a second water-soluble ligand, and a plurality of second quantum dots.

9. The manufacturing method according to claim 8, wherein the first and second quantum dots are different in size but the same in material, and comprise at least one of CdS, CdSe, CdTe, ZnS, ZnSe, ZnTe, HgS, HgTe, GaN, GaAs, InP, or InAs.

10. The manufacturing method according to claim 6, wherein the photoresist material comprises at least one of polymethylmethacrylate, polyester, or epoxy.

11. A quantum dot layer, comprising:
   a first transparent layer comprising regions corresponding to a plurality of pixel regions, each pixel region of the plurality of pixel regions comprising a first subpixel region and a region other than the first subpixel region, wherein the region other than the first subpixel region comprises a second subpixel region;
   a first lyophobic layer located on an upper surface of a first specified region of the first transparent layer, the first specified region corresponding to the region other than the first subpixel region, the first lyophobic layer comprising an element constituting the first transparent layer;
   a first quantum dot sublayer located in a region that corresponds to the first subpixel region, on the first transparent layer;
   a second transparent layer covering the first quantum dot sublayer and the first lyophobic layer;
   a second lyophobic layer located on an upper surface of a second specified region of the second transparent layer, the second specified region corresponding to a region other than the second subpixel region, the second lyophobic layer comprising an element constituting the second transparent layer; and a second quantum dot sublayer located in a region that corresponds to the second subpixel region, on the second transparent layer.

12. The quantum dot layer according to claim 11, wherein the region other than the first subpixel region further comprises a third subpixel region, the second subpixel region located between the first subpixel region and the third subpixel region.

13. The quantum dot layer according to claim 11, wherein:
the first lyophobic layer is a surface fluorination layer of the first transparent layer; and/or
the second lyophobic layer is a surface fluorination layer of the second transparent layer.

14. A quantum dot color filter, comprising:
a first color filter layer in a first subpixel region, comprising a first color filter sublayer and first transparent sublayers located on upper and lower sides of the first color filter sublayer;
a second color filter layer in a second subpixel region, comprising a second color filter sublayer and a second transparent sublayer located between the second color filter sublayer and a base substrate; and
a third color filter layer in a third subpixel region, comprising a third transparent sublayer, wherein:
the second subpixel region is located between the first subpixel region and the third subpixel region;
the first transparent sublayer, the second transparent sublayers, and the third transparent sublayer are of the same material, comprising a photoresist material;
the first color filter layer further comprises a lyophobic layer located on a side of a first transparent sublayer of the first transparent sublayers farther from the base substrate, away from the first color filter sublayer; and
the third color filter layer further comprises a lyophobic layer located on a side of the third transparent sublayer away from the base substrate.

15. A color filter substrate, comprising the quantum dot color filter according to claim 14.

16. A display panel comprising the color filter substrate according to claim 15.

17. A display device comprising the display panel according to claim 16.

* * * * *